(12) United States Patent
Voronin et al.

(10) Patent No.: US 11,133,194 B2
(45) Date of Patent: Sep. 28, 2021

(54) METHOD FOR SELECTIVE ETCHING AT AN INTERFACE BETWEEN MATERIALS

(71) Applicant: Tokyo Electron Limited, Tokyo (JP)

(72) Inventors: Sergey Voronin, Albany, NY (US); Christopher Catano, Albany, NY (US); Nicholas Joy, Albany, NY (US); Alok Ranjan, Austin, TX (US); Christopher Talone, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/796,675

(22) Filed: Feb. 20, 2020

(65) Prior Publication Data

US 2020/0266070 A1     Aug. 20, 2020

Related U.S. Application Data

(60) Provisional application No. 62/808,078, filed on Feb. 20, 2019.

(51) Int. Cl.
*H01L 21/02* (2006.01)
*H01L 21/3065* (2006.01)
(Continued)

(52) U.S. Cl.
CPC .... *H01L 21/3065* (2013.01); *H01L 21/02532* (2013.01); *H01L 21/30655* (2013.01);
(Continued)

(58) Field of Classification Search
None
See application file for complete search history.

(56) References Cited

U.S. PATENT DOCUMENTS

2012/0129354 A1   5/2012   Luong
2015/0364611 A1   12/2015  Funch et al.
(Continued)

FOREIGN PATENT DOCUMENTS

KR   20180091939 A   8/2018

OTHER PUBLICATIONS

Borel, S., et al., "Control of Selectivity between SiGe and Si in Isotropic Etching Processes," Japanese Journal of Applied Physics, vol. 43, No. 6B, 2004, 4 pages.
(Continued)

*Primary Examiner* — Stephanie P Duclair
(74) *Attorney, Agent, or Firm* — Slater Matsil, LLP

(57) ABSTRACT

A method of etching a substrate includes generating plasma comprising a first concentration of an etchant and a second concentration of an inhibitor and etching the substrate by exposing an exposed interface between a first material and a second material to the plasma. The first material includes a lower reactivity to both the etchant and the inhibitor than the second material. The first concentration is less than the second concentration. Etching the substrate includes etching the first material and the second material at the exposed interface to form an etched indentation including an enriched region of the second material, forming a passivation layer at the enriched region using the inhibitor, and etching the first material at the etched indentation. The passivation layer reduces an etch rate of the second material to a reduced rate that is less than an etch rate of the first material.

20 Claims, 7 Drawing Sheets

(51) Int. Cl.
*H01L 21/311* (2006.01)
*H01L 21/3213* (2006.01)
*H01L 29/423* (2006.01)
*H01L 29/786* (2006.01)

(52) U.S. Cl.
CPC ...... *H01L 21/311* (2013.01); *H01L 21/31105* (2013.01); *H01L 21/31111* (2013.01); *H01L 21/32136* (2013.01); *H01L 21/32137* (2013.01)

(56) References Cited

U.S. PATENT DOCUMENTS

| | | | | |
|---|---|---|---|---|
| 2015/0372119 | A1* | 12/2015 | Zhang | H01L 21/02233 438/268 |
| 2017/0194430 | A1 | 7/2017 | Wood et al. | |
| 2017/0271165 | A1* | 9/2017 | Kal | H01J 37/32724 |
| 2018/0204728 | A1 | 7/2018 | Oomori et al. | |

OTHER PUBLICATIONS

Borel, S., et al., "Isotropic etching of SiGe alloys with high selectivity to similar materials," Microelectronic Engineering 73-74, 2004, 5 pages.

Campo, A., et al., "Comparison of etching processes of silicon and germanium in SF6-O2 radio-frequency plasma," J. Vac. Sci. Technol. B, Nanotechnol. Microelectron. Mater. Process. Meas. Phenom. 13(2), Mar./Apr. 1995, 8 pages.

Campo, A., et al., "Investigation of Si and Ge etching mechanisms in radiofrequency CF 2-O2 plasma based on surface reactivities," Plasma Sources Sci. Technol. 4(3), 1995, 9 pages.

Caubet, V., et al., "Mechanisms of isotropic and selective etching between SiGe and Sia," Journal of Vacuum Science and Technology B, Nov./Dec. 2006, 8 pages.

Chen, Zhiying, et al., "Measurement of electron temperatures and electron energy distribution functions in dual frequency capacitively coupled CF4/O2 plasmas using trace rare gases optical emission spectroscopy," J. Vac. Sci. Technol. A Vacuum, Surfaces, Film. 27(5), Sep./Oct. 2009, 8 pages.

Henry, M. David, et al., "Isotropic Plasma Etching of Ge, Si and SiNx Films," J. Vac. Sci. Technol. B, Nanotechnol. Microelectron. 34(5), 2016, 17 pages.

Hikavyy, A., et al., "Use of high order precursors for manufacturing gate all around devices," Materials Science in Semiconductor Processing, 70, 2017, Sep. 2016, 6 pages.

Matsuo, P. J.,et al., "Silicon etching in NF3/O2 remote microwave plasmas," Journal of Vacuum Science and Technology A, Vacuum, Surfaces, Film. 17(5), 1999, 8 pages.

Mogab, C. J., et al., "Plasma etching of Si and SiO 2 The effect of oxygen additions to CF 4 plasmas," J. Appl. Phys. 49(7), Jul. 1978, 9 pages.

Nagy, Daniel., et al., "FinFET versus gate-all-around nanowire FET: Performance, scaling, and variability," IEEE Journal of the Electron Devices Society, vol. 6, 2018, 9 pages.

Oehrlein, G. S., et al., "Selective dry etching of silicon with respect to germanium," Appl. Phys. Lett. 56(15), 56, (15), Apr. 9, 1990, 4 pages.

Oehrlein, G. S.,et al., "Interactive effects in the reactive ion etching of SiGe alloys," Appl. Phys. Lett. 58 (20), May 20, 1991, 4 pages.

Oehrlein, G.S., et al., "Studies of the reactive ion etching of SiGe alloys," J. Vac. Sci. Technol. A Vacuum, Surfaces, Film. 9(3), 7, May/Jun. 1991, 8 pages.

Serry, Mohamed et al., Silicon Germanium as a novel mask for silicon deep reactive ion etching, Journal of Microelectromechanical Systems, vol. 22, No. 5, Oct. 2013, 9 pages.

Zhang, Ying, et al., "Reactive ion etching of SiGe alloys using fluorine-containing plasmas," Journal of Micr. Vac. Sci. Technol. A Vacuum, Surfaces, Film. 11(5), Sep./Oct. 1993, 5 pages.

* cited by examiner

METHOD FOR SELECTIVE ETCHING AT AN INTERFACE BETWEEN MATERIALS

This application claims priority to U.S. Provisional Application No. 62/808,078, filed on Feb. 20, 2019, which application is hereby incorporated by reference in its entirety.

TECHNICAL FIELD

The present invention relates generally to methods of selective etching, and, in particular embodiments, to methods of selective etching at an interface between materials and to systems and structures utilized therein.

BACKGROUND

Within the world of integrated circuit manufacturing there is a continuous effort to increase device density in order to improve speed, performance and costs. In order for the semiconductor industry to continue scaling to smaller node sizes, device architectures have evolved from two-dimensional (2D) planar structures to three-dimensional (3D) vertical structures, such as with nanowires or vertically oriented transistors. The motivation for this change is derived from insufficient control of the conducting channel by the gate potential. Short channel effects (SCE) may become too significant as gate dimensions are scaled and result in an increase in current conduction when no voltage is applied to the gate ($I_{off}$). Thus, a change in device architecture may enable better electrostatic control of the gate to reduce the SCE and power loss.

The fabrication of nanowire devices may present 3D etch challenges where both anisotropic and highly selective isotropic etch processes are beneficial. For example, layers of exposed materials may need to be etched relative to one another to create recessed regions. Which specific material should be the etching target may depend on the type of device. For example, a substrate may include a more reactive exposed material that forms an interface with a less reactive exposed material. For some applications, the more reactive material may need to be selectively etched relative to the less reactive material. However, in other applications, the less reactive material may need to be selectively etched relative to the more reactive material introducing challenges. Methods of etching the less reactive material selective to the more reactive material may be beneficial.

SUMMARY

In accordance with an embodiment of the invention, a method of etching a substrate includes providing the substrate in a plasma chamber, generating plasma comprising a first concentration of an etchant and a second concentration of an inhibitor in the plasma chamber, and etching the substrate by exposing an exposed interface to the plasma. The substrate includes the exposed interface that is between a first material and a second material. The first material includes a lower reactivity to both the etchant and the inhibitor than the second material. The first concentration is less than the second concentration. The etching includes etching the first material and the second material at the exposed interface using the etchant to form an etched indentation including an enriched region of the second material, forming a passivation layer at the enriched region of the second material using the inhibitor, and etching the first material at the etched indentation. The passivation layer reduces an etch rate of the second material to a reduced rate. The first material is etched at the etched indentation at an etch rate that is greater than the reduced rate.

In accordance with another embodiment of the invention, a method for treating a substrate includes receiving the substrate supported by a substrate chuck in a plasma chamber and exposing exposed ends of an alternating film stack to plasma containing a fluorine-oxygen chemistry of less than a 0.3:1 concentration ratio of atomic fluorine to atomic oxygen ([F]:[O]). The substrate includes the alternating film stack including alternating silicon and silicon germanium film layers, each with opposing exposed ends. The fluorine-oxygen chemistry is generated by applying power to fluorine-based gases and $O_2$ gases flowed into the plasma chamber. The method further includes forming a recessed alternating film stack by selectively etching the exposed ends of the silicon film layers based on the exposure of the fluorine-oxygen chemistry to the exposed ends. The silicon film layers of the recessed alternating film stack include a first average width that is less than a second average width of the silicon germanium layers of the recessed alternating film stack.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A, 1B, and 1C illustrate an example process of treating a substrate in accordance with an embodiment of the invention in which FIG. 1A shows the substrate prior to processing, FIG. 1B shows the substrate after an etched indentation has been formed to start an etching process, and FIG. 1C shows the substrate at a subsequent point during the etching process;

FIGS. 2A, 2B, and 2C illustrate another example process of treating a substrate in accordance with an embodiment of the invention in which FIG. 2A shows a substrate including an alternating film stack including a first material and a second material, FIG. 2B shows the resulting recessed alternating film stack formed if the first material is selectively etched from the alternating film stack, and FIG. 2C shows the resulting oppositely recessed alternating film stack formed if the second material is selectively etched from the alternating film stack;

Figure 1A:
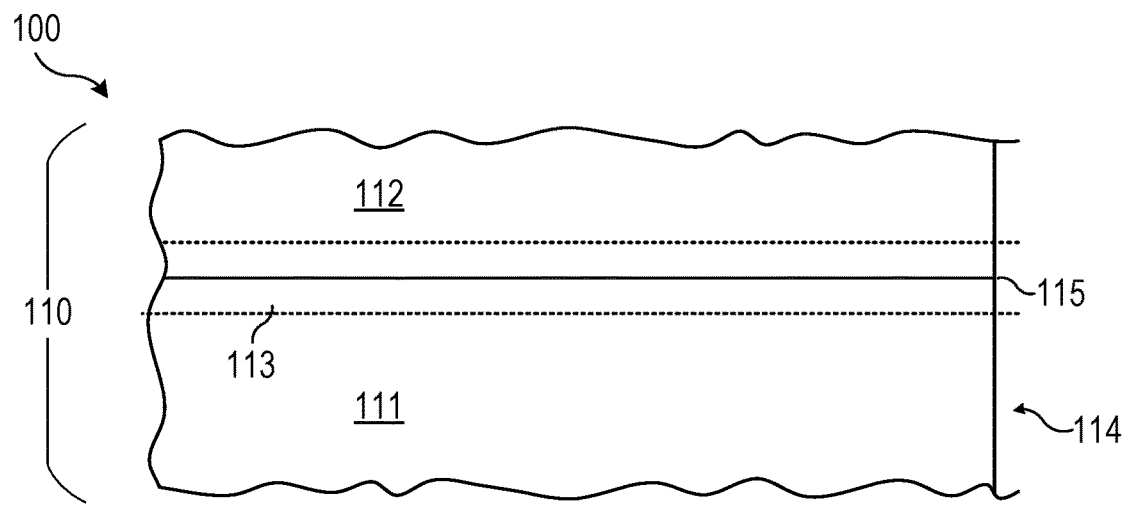

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

There exists a variety of techniques for selectively etching one material relative to another material. For example, in some cases the chemistry of the two materials is sufficiently distinct so as to allow entirely different etchants to be used to etch each material independent of the other. However, in other cases it may be more difficult to determine appropriate etching regimes for selective etching because the chemistry of the materials may be similar or the available etching processes may be limited by other factors.

In applications where the chemistry between materials is similar, higher reactivity of a first material to a species may be leveraged in order to selectively etch the first material in the presence of the second material. However, the second material with lower reactivity may also need to be selectively etched relative to the first material. Conventional processes may be unable to achieve selective etching of the first material or may fall short of process requirements such as selectivity, etch profile, and others.

In various embodiments, a method of treating a substrate in a plasma chamber includes generating plasma in a plasma chamber that has both an etchant and an inhibitor. The concentration of the etchant within the plasma is less than the concentration of the inhibitor. During an etching process the etchant functions as a species that reacts with a material to consume or remove the material while the inhibitor functions as a species that reacts with a material to reduce or eliminate the ability of the etchant to react with a material.

The substrate includes an exposed interface between a first material and a second material. The first material has a lower reactivity to both the etchant and the inhibitor than the second material. The method further includes selectively etching the first material relative to the second material by exposing the interface to the plasma.

The embodiment methods may advantageously enable selective etching of a less reactive material in the presence of a more reactive material. For example, in certain specific applications, a substrate may include an alternating film stack of silicon (Si) and silicon germanium (SiGe). The SiGe layers may be more reactive to various etchants, e.g. fluorine (F), and to various inhibitors, e.g. oxygen (O), than the pure Si layers due to the presence of Ge. Consequently, the SiGe layers may be selectively etched relative to the Si layers by virtue of the higher reactivity of the SiGe. A possible advantage of embodiment methods described herein is to also enable so-called "selectivity inversion" where the Si layers are selectively etched relative to exposed SiGe layers despite the higher reactivity of the SiGe.

Embodiment methods herein may have a further advantage of being dry etching processes. Conventional methods targeting similar outcomes may disadvantageously be wet etching processes. The embodiment methods herein may also carry the benefit of enabling lateral etching. For example, the methods as described are isotropic etching processes which may allow undercutting of materials such as during selective lateral etching of film stacks.

A further possible advantage of the embodiment methods as described is precise control over etching profile. For example, various parameters may be varied such that the etch front of the etched material may be substantially flat. Additionally, in applications involving lateral etching of film stacks, the height of the etched recesses in the film stack may advantageously be substantially constant. Another possible advantage may be that the width variation of the layers after etching may be minimal.

Embodiments provided below describe various methods of selective etching, and in particular embodiments, to methods of selective etching at an interface between materials and to systems and structures utilized therein. The following description describes the embodiments. Two embodiment processes of treating a substrate are described using FIGS. 1A-1C and 2A-2C. An embodiment recessed alternating film stack is described using FIG. 3 while FIG. 4 is used to described an embodiment device. An embodiment system for plasma processing is described using FIG. 5. Two embodiment methods are described using FIGS. 6 and 7.

Figure 1B:
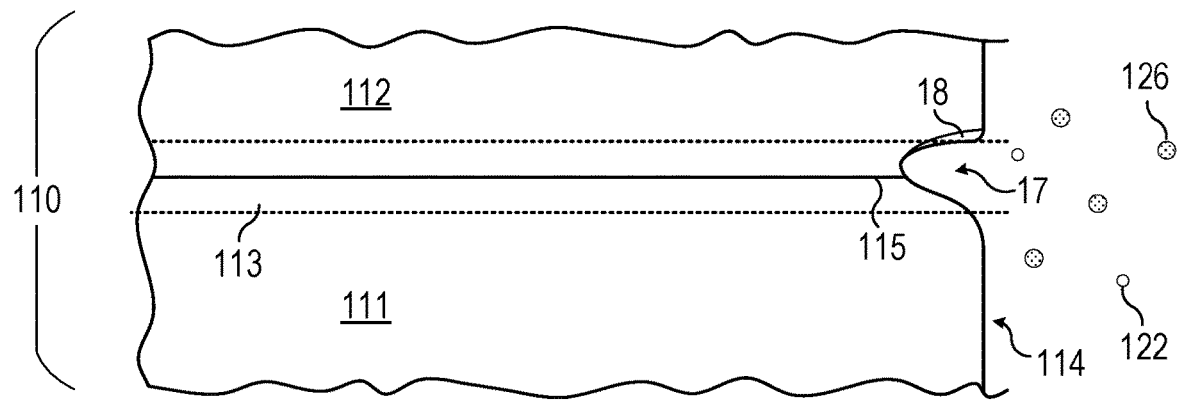
Figure 1C:
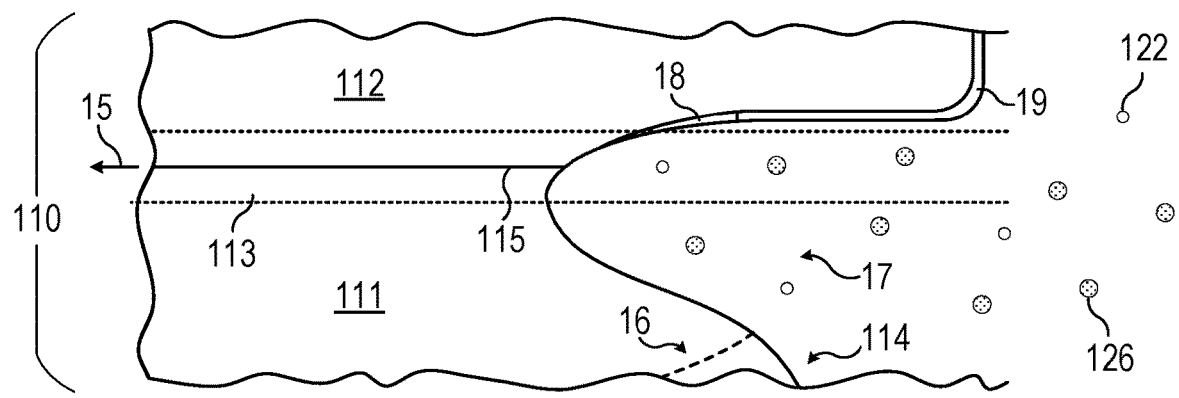

FIGS. 1A, 1B, and 1C illustrate an example process of treating a substrate in accordance with an embodiment of the invention. FIG. 1A shows the substrate prior to processing. FIG. 1B shows the substrate after an etched indentation has been formed to start an etching process. FIG. 1C shows the substrate at a subsequent point during the etching process.

Referring to FIG. 1A, a substrate 110 including a first material 111 and a second material 112 is shown at an initial stage of a process too of treating the substrate 11o. The first material 111 and the second material 112 are disposed adjacent to one another such that an interface 115 between the two materials exists. In some embodiments, chemical characteristics of the first material 111 and the second material 112 may diffuse across the interface 115 creating a mixed region 113. The substrate 110 includes at least one exposed surface 114 at which the interface 115 is exposed to the environment.

The substrate 110 may be any suitable material or combination of materials and be at any stage of processing. In various embodiments, the substrate 110 comprises a semiconductor material. The substrate 110 may also include various insulating and/or conducting materials. In some embodiments, the substrate 110 comprises silicon and is a silicon substrate in one embodiment. In another embodiment, the substrate 110 is a silicon-on-insulator (SOI) substrate.

Referring now to FIG. 1B, the substrate 110 is exposed to an etchant 122 and an inhibitor 126 during the process too. The concentration of the etchant 122 is less than the concentration of the inhibitor 126. Each of the etchant 122 and the inhibitor 126 may be provided at the substrate 110 as a gas. In various embodiments, the etchant 122 comprises a halogen and comprises fluorine (F) in one embodiment. The inhibitor 126 comprises a reducing agent in some embodiments, and comprises oxygen (O). However, the etchant 122 and the inhibitor 126 may be any suitable substance as may be apparent to those of skill in the art.

Each of the etchant 122 and the inhibitor 126 may be supplied directly as a gas or generated from plasma. The etchant 122 and the inhibitor 126 react with both the first material 111 and the second material 112. However, the first material 111 has a lower reactivity to both the etchant 122 and the inhibitor 126 than the second material 112. In other words, the etchant 122 and the inhibitor 126 both react at a higher rate with the second material 112 than with the first material 111.

An etched indentation 17 is formed due to an etching process of the etchant 122 at the interface 115. The etched indentation 17 may include an enriched region 18 comprised of increased concentrations of a chemical characteristic of the second material 112. For example, the second material 112 may include a chemical species that has higher reactivity (e.g. higher affinity) to one or both of the etchant 122 and the inhibitor 126. This reactive chemical species may have a higher relative concentration in the enriched region 18 than in the bulk of the second material 112.

Now in reference to FIG. 1C, the substrate 110 continues to be exposed to the etchant 122 and the inhibitor 126 during the process too. As shown, the etched indentation 17 broadens and deepens as the process too continues to etch the first material 111 and the second material 112 along the interface 115. The enriched region 18 also continues to form at or near the mixed region 113 and the interface 115. However, a passivation layer 19 forms at portions of the enriched region 18 that are exposed to the inhibitor 126 for a sufficient amount of time.

The passivation layer 19 has lower reactivity to the etchant 122 thereby slowing the etch rate of the second material 112 from an initial rate (e.g. the etch rate at the stage of the process too depicted in FIG. 1B) to a reduced etch rate. The reduced etch rate is effectively zero in one embodiment. Consequently, the etching process is effectively bounded by the second material 112. Meanwhile the etch rate of the first material 111 is substantially unchanged from the initial etch rate and is greater than the reduced etch rate of the second material 112. That is, the overall etching process is selective to the first material 111 (i.e. the lower reactivity material).

The net effect of the disparity in etch rates of the first material 111 relative to the second material 112 is to selectively etch the first material 111 along the interface 115 in a direction 15 that is parallel to the interface 115. In this way, the surface of the expanding etched indentation 17 is an etch front for the process too of treating the substrate 110 and the etching process is advantageously an isotropic etching process. It should be noted that the interface 115 and resulting direction 15 of etching is horizontal resulting in a lateral (e.g. undercutting) etching process. However, any orientation of interface is possible. For example, the interface may be vertically oriented and result in a vertical (e.g. trench or hole) etching process. Further, the interface 115 may not be straight in some embodiments.

Since the etch rates may depend on the relative concentrations of the etchant 122 and the inhibitor 126, the selectivity of the etching process to the first material 111 may be maximized by varying the etchant:inhibitor ratio as well as other process parameters such as temperature. Further, the etching process may also be selective relative to the first material 111 relative to other materials included in the substrate 110 in addition to the second material 112.

The formation of the passivation layer 19 at a substantially constant rate from the enriched region 18 may advantageously create a substantially planar surface that is also parallel to the direction 15. Additionally, the passivation layer 19 may form on a small time scale advantageously resulting in a consistent amount of the second material 112 being etched. In contrast, the first material 111 may not take part in sufficient passivation chemistry to stop of substantially slow the etching process in the vicinity of the interface 115. However, an additional layer of the second material (not shown) may optionally be included to form an additional interface on the opposite side of the first material. This additional interface may facilitate the formation of an optional opposing etch front 16. For example, this configuration may be leveraged to form recessed alternating film stacks as described herein.

The potential selectivity mechanisms for the above etching process in the specific example of an isotropic dry etch using an inhibitor comprising oxygen may be based on preferential oxidation of the second material 112 relative to the first material 111. An oxidized layer (e.g. passivation layer 19) on the second material 112 may advantageously act to passivate previously exposed surfaces of the second material 112 from the etching process. The etching mechanism may be based on a so-called "unzipping effect", such that the second material 112 is both etched and passivated simultaneously, while the first material continues to be etched isotropically.

In an extension of the above specific example, the etchant 122 may be fluorine, the first material 111 may be silicon (Si), and the second material 112 may be silicon germanium (SiGe). For example the second material 112 may be an SiGe alloy (i.e. mixture) in an appropriate ratio (e.g. $Si_{0.7}Ge_{0.3}$, $Si_{0.75}Ge_{0.25}$, etc.) for desired etching properties of a given application. The above mechanism and etching process may advantageously be a dry etch process that is highly selective to Si relative to SiGe despite the higher reactivity of SiGe to both the fluorine etchant and the oxygen inhibitor.

Specifically, etching with atomic F (e.g. etchant 122) at the Si:SiGe interface (e.g. interface 115) may result in Ge surface enrichment (e.g. enriched region 18). Consequently, a maximized etch rate of the SiGe layer at the Si:SiGe interface may be achieved. However, as the exposed Si:SiGe interface continues to etch, the Ge enriched region may then enable rapid formation of an etch stopping layer (e.g. passivation layer 19) when O consumes dangling Ge bonds on the SiGe surface to form a nonreactive layer (e.g. $GeO_2$) that prevents or substantially reduces further etching. By comparison, the Si may continue to be etched through the formation of a $SiO_xF_y$ reaction layer; the presence of O may replace some F sites on the Si surface slowing, but not stopping the formation of etch product.

The presence of the interface of between the first material 111 and the second material 112 may be advantageous for etching of the first material 111 to occur at an appreciable rate. Due to the high reactivity of the second material 112 to the inhibitor 126, if standalone structures of the second material 112 were exposed to the etchant 122 and the inhibitor 126 a passivation layer would likely immediately form and the etch rate could fall to zero. Similarly, standalone structures of the first material 111 would likely etch at an undesirably slow rate possibly due to the higher concentration of the inhibitor 126 relative to the etchant 122.

Figure 2A:
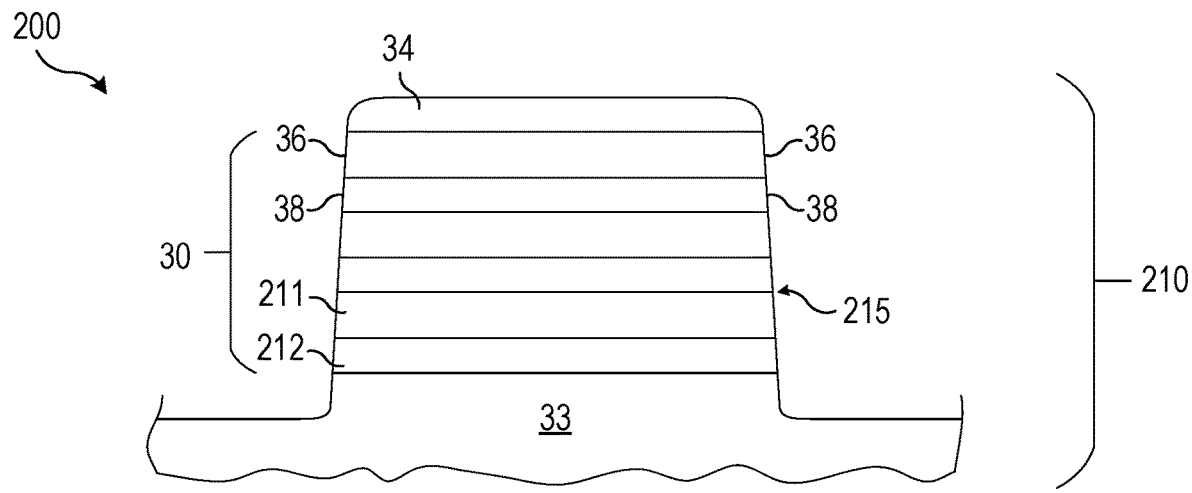
Figure 2B:
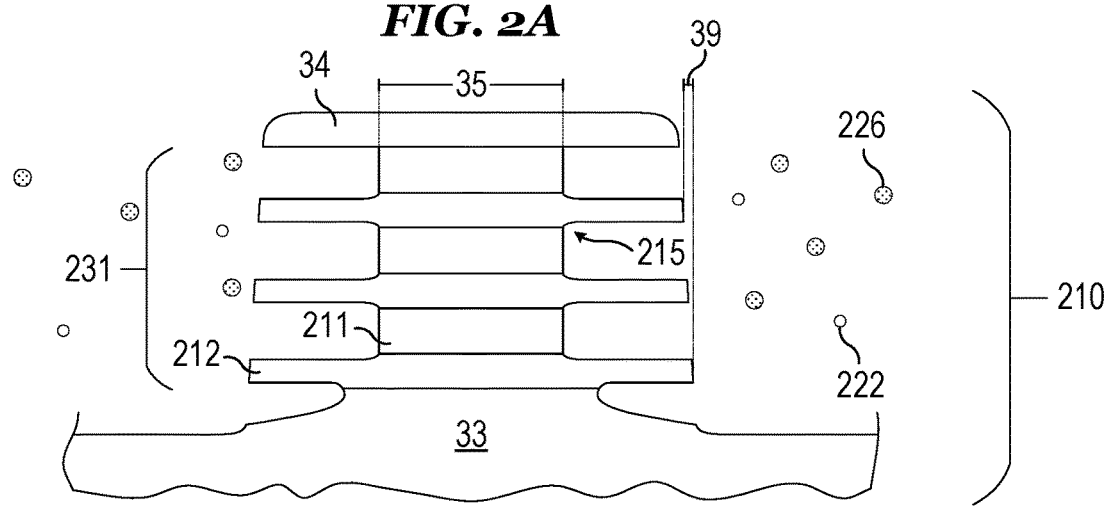
Figure 2C:
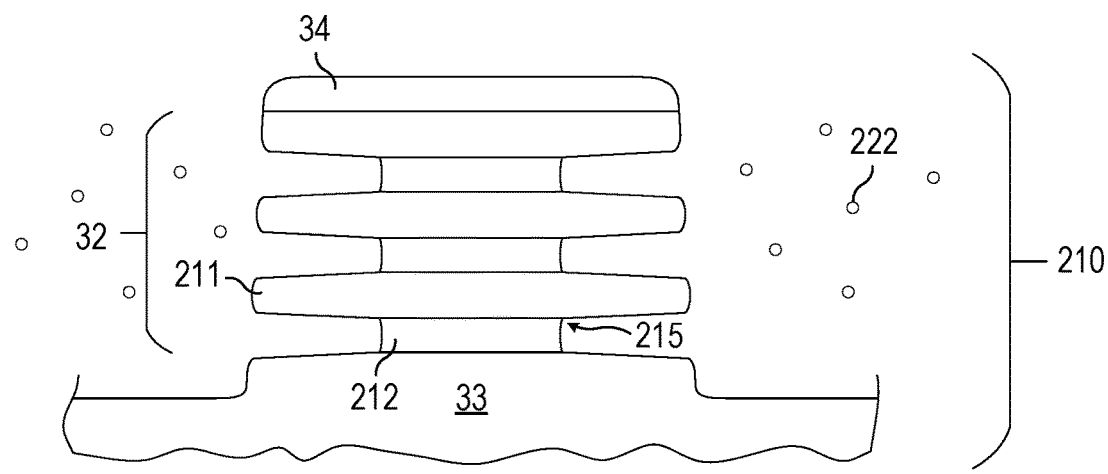

FIGS. 2A, 2B, and 2C illustrate another example process of treating a substrate in accordance with an embodiment of the invention. FIG. 2A shows a substrate including an alternating film stack including a first material and a second material. FIG. 2B shows the resulting recessed alternating film stack formed if the first material is selectively etched from the alternating film stack. FIG. 2C shows the resulting oppositely recessed alternating film stack formed if the second material is selectively etched from the alternating film stack. The process of FIGS. 2A, 2B, and 2C may be specific implementations of other processes described herein such as the process of FIGS. 1A-1C, for example. Similarly labeled elements may be as previously described.

Referring to FIG. 2A, a substrate 210 including an alternating film stack 30 disposed on a base material 33 is shown at an initial stage of a process 200 of treating the substrate 210. The substrate 210 may be a specific implementation of the substrate 110 of FIGS. 1A-1C, for example. It should be noted that here and in the following a convention has been adopted for brevity and clarity wherein elements adhering to the pattern x10 may be related implementations of a substrate in various embodiments. An analogous convention has also been adopted for other elements as made clear by the use of similar terms in conjunction with the aforementioned three-digit numbering system.

The alternating film stack 30 includes alternating film layers of a first material 211 and a second material 212. The base material 33 may be any suitable material and is silicon in one embodiment. The alternating film stack 30 may be made by growing alternating heteroepitaxial layers of the first material 211 (e.g. Si) and the second material 212 (e.g. SiGe) atop the base material 33 (e.g. Si (100)). An optional hard mask 34 may also be included on top of the alternating film stack 30. The optional hard mask 34 may be used to form the structure of the alternating film stack 30 relative to the base material 33 in a previous etching process, for example. In one embodiment, the optional hard mask 34 is silicon nitride (SiN). As shown, the base material 33 may be etched such that a portion of the base material 33 has the same pattern as the alternating film stack 30, but this is not a requirement.

Each of the film layers in the alternating film stack 30 have a pair of exposed ends when viewed from a cross-sectional perspective as illustrated. That is, each of the film layers of the first material 211 have a pair of exposed ends of the first material 36 and each of the film layers of the second material 212 have a pair of exposed ends of the second material 38. The alternating film layers are stacked directly on top of one another so as to form an interface 215 at each abutment of the first material 211 and the second material 212.

Referring now to FIGS. 2B and 2C, the alternating film stack 30 may be selectively etched in two different ways. In a first regime, illustrated in FIG. 2B and conceptually similar to the process of FIGS. 1A-1C, each of the film layers of the first material 211 is selectively etched relative to each of the film layers of the second material 212 to form a recessed alternating film stack 231. However, in a second regime illustrated in FIG. 2C each of the film layers of the second material 212 is selectively etched relative to each of the film layers of the first material 211 to form an oppositely recessed alternating film stack 32.

This selectivity inversion may be achieved by controlling the concentration of an etchant 222 relative to an inhibitor 226. In the case of FIG. 2C, where the second material 212 is selectively etched, the high reactivity of the second material 212 to the etchant 222 is utilized to enable the selectivity. In contrast, the inhibitor 226 is added along with the etchant 222 in the case of FIG. 2B and selectivity inversion occurs. Other parameters may also be varied to control the effective concentration of the inhibitor 226 available at the substrate 210. For example, increased pressure may increase the selectivity of the first material 211. A decrease in temperature may also increase the selectivity of the first material 211.

As shown in FIG. 2B, certain measurements such as exposed end separation 35 and width variation 39 may provide criteria by which the effectiveness of an etching process may be judged. For example, the exposed end separation 35 may be less than 20 nm in some embodiments, and between 2 nm and 20 nm in one embodiment. The exposed end separate may also refer to the separation of exposed ends prior to etching. Similarly, the width variation 39 between exposed ends of the first material 211 is less than about 5 nm in one embodiment. However, the exposed end separation 35 and the width variation 39 may be outside these ranges depending on a given application.

Figure 3:
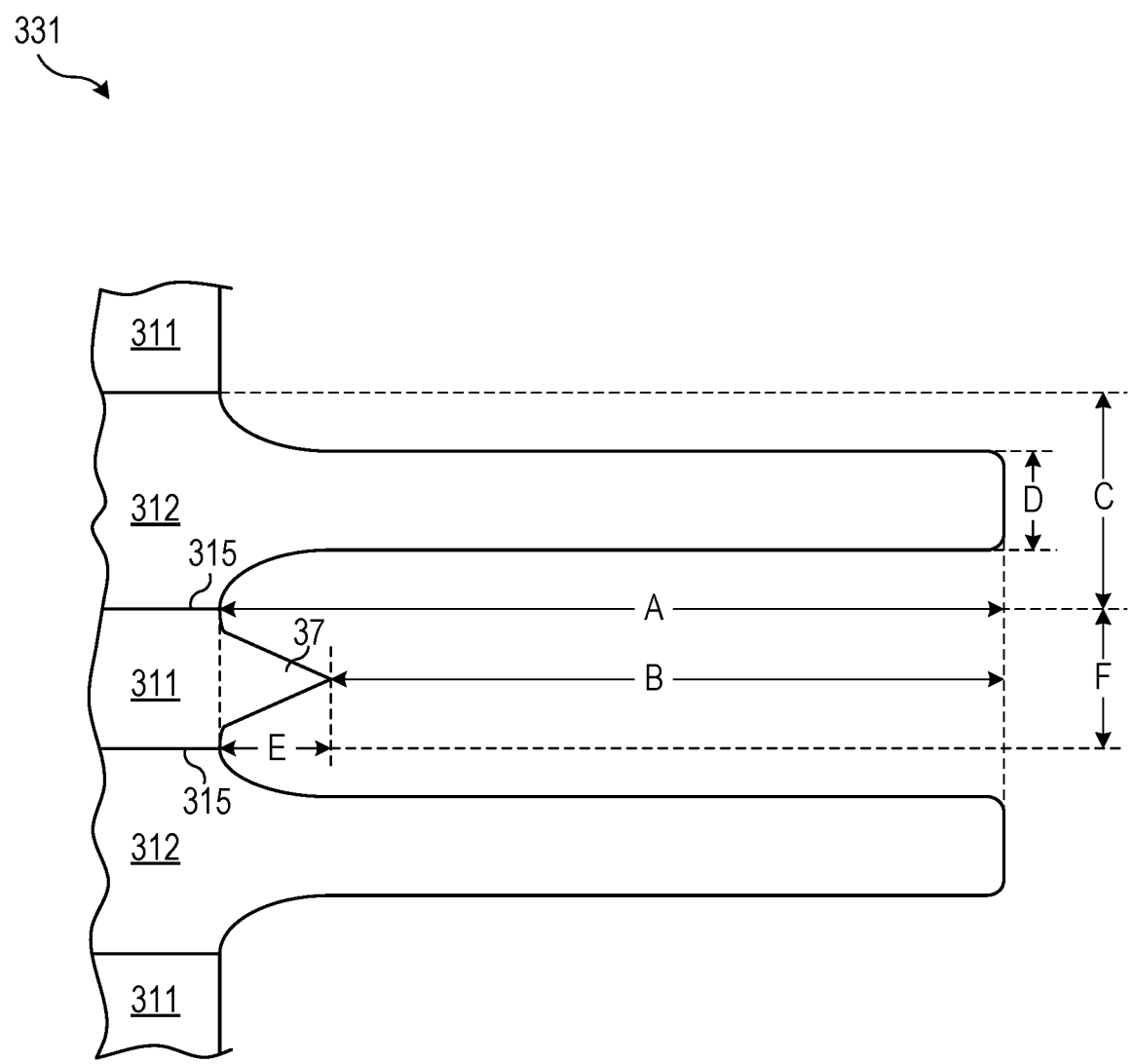
FIG. 3 illustrates an example recessed alternating film stack in accordance with an embodiment of the invention.
Figure 4:
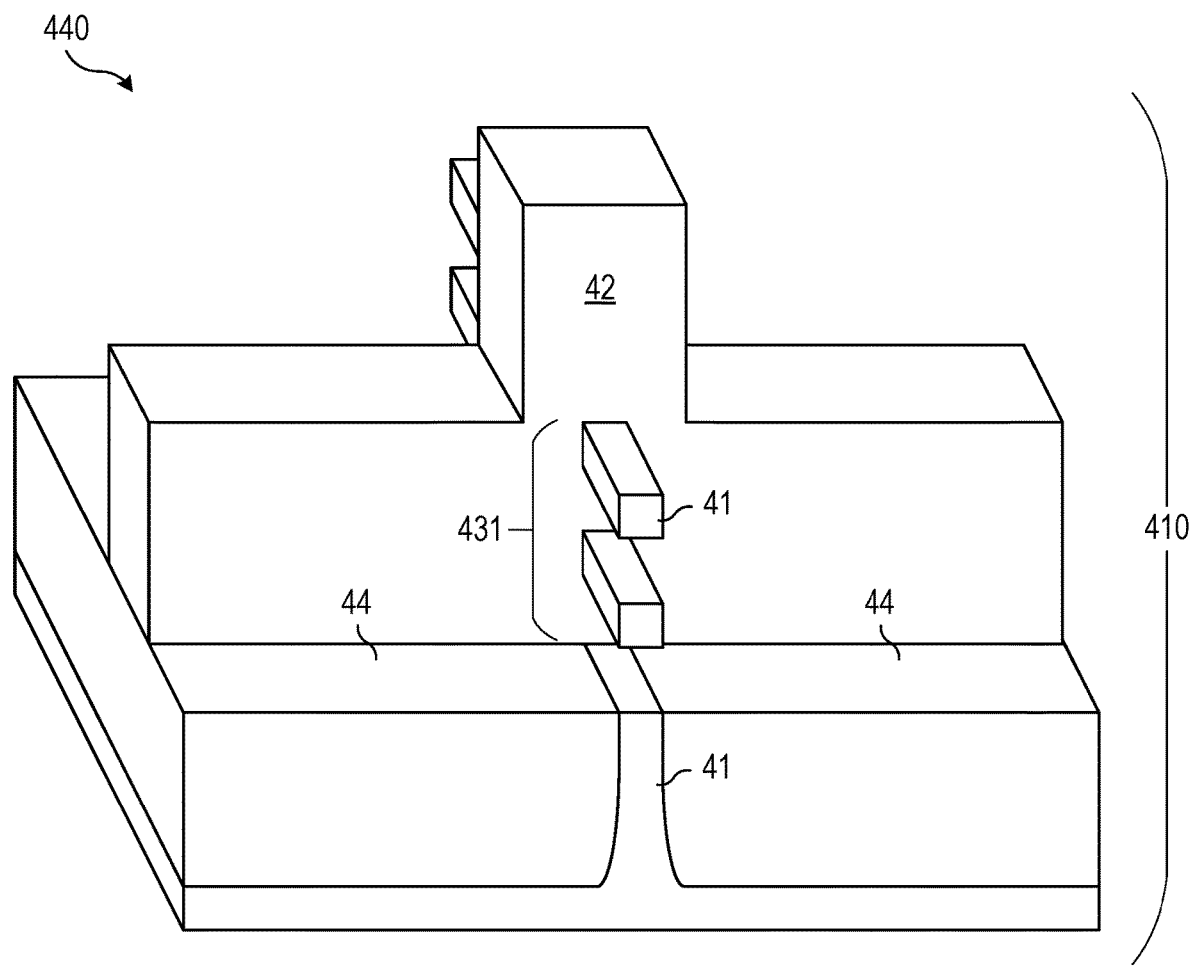
FIG. 4 illustrates an example device including a substrate with a recessed alternating film stack in accordance with an embodiment of the invention.

FIG. 3 illustrates an example recessed alternating film stack in accordance with an embodiment of the invention. The recessed alternating film stack of FIG. 3 may be a specific implementation of other alternating film stacks described herein such as the alternating film stack of FIG. 2, for example. As before, similarly labeled elements may be as previously described.

Referring to FIG. 3, a recessed alternating film stack 331 includes alternating film layers of a first material 311 and a second material 312. The first material 311 layers of the recessed alternating film stack 331 have been selectively etched relative to the second material 312 layers (e.g. with methods and processes described herein). Several measurements may be used to characterize the recessed alternating film stack 331. For example, the length of a second material layer protrusion as measured from an interface 315 between the layers is labeled A. By comparison, the reduction in width of a first material layer is labeled B. It should be noted that these measurements are considered after any width reduction of the second material 312 layers during the etching process. In other words, some width reduction of the second material 312 may occur during the etching process, but is not illustrated for clarity.

As shown, a tip 37 of the first material 311 may form at the etch front between adjacent layers of the second material 312. This results in A differing from B by a tip length E. That is, A−B=E. The tip 37 may be controllable by variation of materials and/or process parameters. The smaller the value of E, the closer the etch front becomes to an ideal flat surface perpendicular to the etching direction.

The original thickness of the second material is labeled as C which is reduced to a final thickness D by the etching process. For example, a passivation layer may form as the etching process proceeds, but only after a small amount of the second material 312 has been etched. This mechanism has been previously described.

The original thickness of the first material 311 is labeled as F. In various embodiments, F is less than C. However, in other embodiments F and C may be equal or F may be greater than C. In some embodiments, C is between about 2 nm and about 60 nm and is 20 nm in one embodiment. In other embodiments, C is about 15 nm or about 10 nm. In various embodiments, F is between about 2 nm and about 50 nm. In one embodiment, F is about 15 nm. In another embodiment, F is about 20 nm. In some embodiments, F is less than 10 nm. In one embodiment, F is about 10 nm.

The selectivity of the etching process to the first material 311 relative to the second material 312 can be defined using the above measurements. For example, assuming no appreciable etching of the second material 312 occurs at the ends of the layers of second material 312, etching of the second material 312 only serves to decrease the thickness from C to D. Similarly, the first material 311 is etched isotropically along the interface resulting in an increase in B. Consequently, the selectivity of the etching process may be defined as the width reduction of the first material 311 divided by the thickness reduction of the second material 312 at a single side of the layer: $B/[(C-D)/2]$.

Practically speaking, the selectivity for a given recessed alternating film stack may be based on average values of the above measurements. For example, the selectivity of the first material 311 relative to the second material 312 may be based on a ratio of an average width change of the first material 311 film layers to an average thickness change of the second material 312 film layers. In various embodiments, this selectivity is greater than 1 and is greater than 20 in some embodiments. For example, the selectivity may be about 50, as high as 100, or higher.

Continuing the specific example of the first material 311 being Si and the second material 312 being SiGe, a Si-tip (e.g. tip 37) may be formed due to slower bulk Si etch rate than the etch rate at the interface. Here, the Si:SiGe selectivity may be defined using the above definition. Assuming a ~5 nm loss of SiGe vertically and a ~60 nm lateral width reduction of Si the Si:SiGe selectivity is 24, as an example.

The length of the Si-tip may be adjusted by varying the concentration ratio of atomic fluorine to atomic oxygen [F]:[O] ratio for the etching process as well as the thickness of the Si layer. For example, as the [F]:[O] ratio increases linearly, the Si-tip length may show an inverse dependency on the [F]:[O] ratio. For high [F]:[O] ratios the decreased Si-tip length may be attributed to smaller O content resulting in milder oxidation of the Si layer allowing for more effective etching by F species. In one embodiment, the [F]:[O] ratio is less than about 0.3:1.

Similarly, the layer thickness may also effect the Si-tip formation. For example, increasing the thickness of the Si layer may result in an increase in the Si-tip length. This may be because the isotropic etch rate of Si is constant in all directions and much slower than the lateral etch rate at the SiGe interface. Thus, if two Si:SiGe interfaces are brought close enough together, the isotropic etch rate of the Si layer may be sufficient to reduce the size of the Si-tip to zero.

FIG. 4 illustrates an example device including a substrate with a recessed alternating film stack in accordance with an embodiment of the invention. The device of FIG. 4 may be formed using any of the processes and methods as described herein, such as the process of FIGS. 1A-1C, the process of FIGS. 2A-2C, and/or either the methods of FIGS. 6 and 7, for example. Similarly labeled elements may be as previously described.

Referring to FIG. 4, a device 440 includes a substrate 410 that includes a channel material 41 (e.g. Si or SiGe) and a gate material 42 (e.g. SiGe or Si). The device 440 may be a gate-all-around (GAA) device as shown here or may be any other device, such as a fin field-effect transistor (FinFET). Isolation regions 44 may also be included in device 440. In one embodiment, the isolation regions 44 are shallow trench isolations (STI).

The device 440 may be fabricated by first forming a recessed alternating film stack 431 and then depositing additional gate material 42 over the recessed alternating film stack 431. Specifically, the device 440 may be formed by heteroepitaxial growth of alternating Si and SiGe layers which are then patterned and recessed vertically to expose them laterally. An isotropic etch of Si selective to SiGe (as shown) may then be used (e.g. as in FIG. 2B) to form a PFET GAA device or an isotropic etch of SiGe selective to Si may be used (e.g. as in FIG. 2C) to form an NFET GAA device.

The application of embodiments described herein may advantageously be an optimal solution for the 5 nm node. For example, the GAA device architecture may be suitable for scaling beyond the 7 nm node. The GAA device architecture may address the SCE found in the FinFET architectures by wrapping the gate around the entire channel instead of only three sides. This could eliminate current leakage occurring under the gate of the FinFET, therefore reducing non-active power losses.

Figure 5:
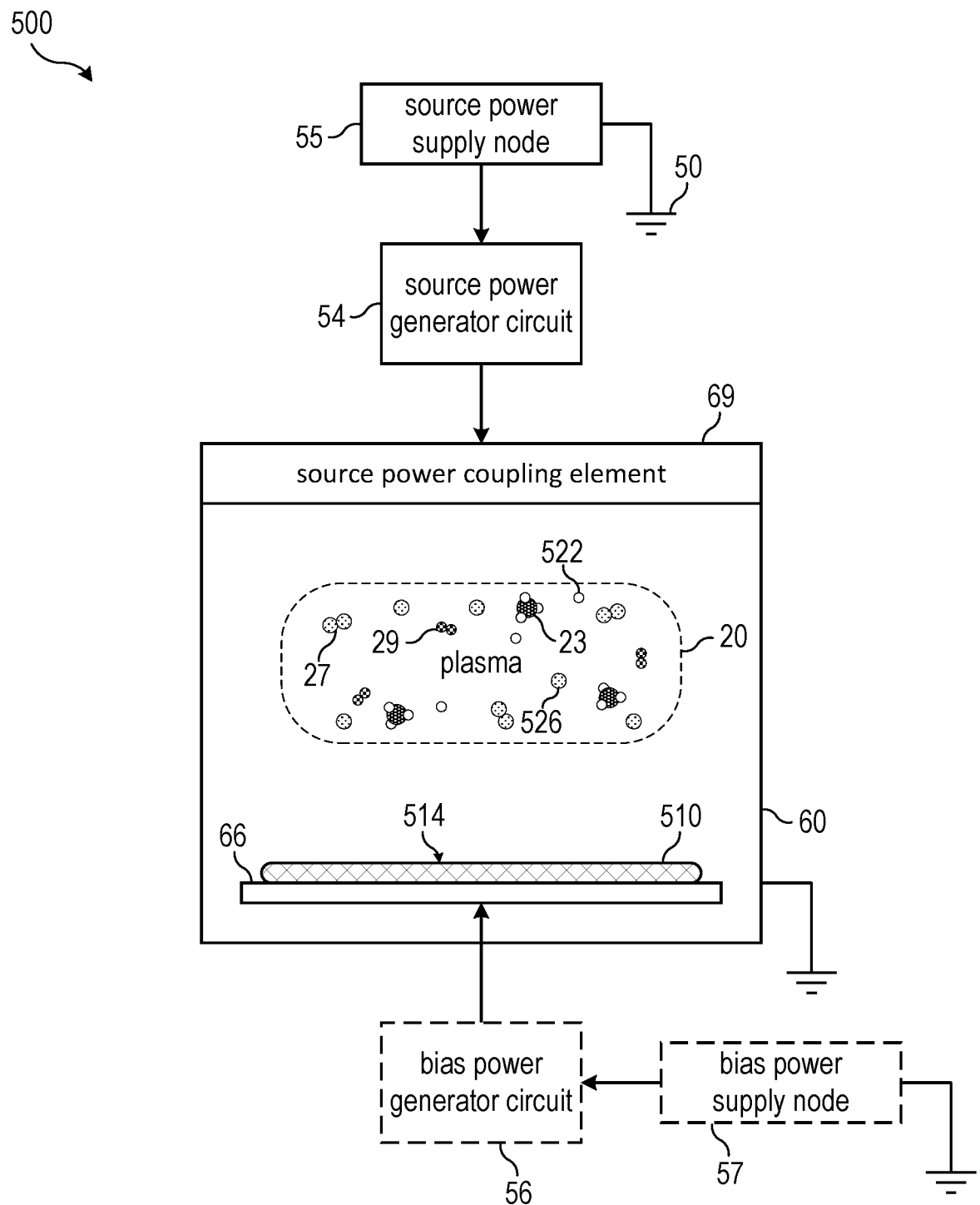
FIG. 5 illustrates an example system for plasma processing in accordance with an embodiment of the invention.

FIG. 5 illustrates an example system for plasma processing in accordance with an embodiment of the invention. The system of FIG. 5 may be used to perform any of the processes and methods as described herein, such as the process of FIGS. 1A-1C, the process of FIGS. 2A-2C, and/or either the methods of FIGS. 6 and 7, for example. Similarly labeled elements may be as previously described.

Referring to FIG. 5, a system 500 for plasma processing includes a plasma chamber 60 and a source power coupling element 69. The source power coupling element 69 is configured to generate plasma 20 within the plasma chamber 60 using power from a source power supply node 55. The plasma 20 may be any suitable type of plasma. In one embodiment, the plasma 20 is a surface wave plasma (SWP). Alternatively, the plasma 20 may be an inductively coupled plasma (ICP), a capacitively coupled plasma (CCP), and others.

The source power supply node 55 is coupled to ground 50 and also to the source power coupling element 69 through a source power generator circuit 54. In one embodiment, the source power generator circuit 54 provides alternating current (AC) power. For example, the AC power may be radio frequency (RF) power. The plasma chamber 60 may also be grounded (e.g. coupled to ground 50 or to a separate ground connection).

A substrate chuck 66 is included in the plasma chamber 60. The substrate chuck 66 is configured to support a substrate 510 which includes an exposed surface 514. For example, the exposed surface 514 may be positioned to interact with various species formed by the plasma 20 and provided into the plasma chamber 60. The substrate chuck 66 may be provided with bias power. For example, the substrate chuck 66 may optionally be coupled to a bias power supply node 57 through a bias power generator circuit 56. The bias power generator circuit 56 may provide direct current (DC) offset AC power, for example. The bias power supply node 57 may be also be grounded (e.g. coupled to ground 50 or to a separate ground connection).

An etchant source gas 23 may be provided into the plasma chamber 60 and provide the etchant 522 either directly or indirectly through formation within the plasma 20o. Similarly, when an inhibitor 526 is included, an inhibitor source gas 27 may also be provided into the plasma chamber 60. The inhibitor 526 may also be provided directly from the inhibitor source gas 27 or generated in the plasma 20.

In one embodiment, the etchant source gas 23 is tetrafluoromethane ($CF_4$). In another embodiment, the etchant source gas 23 is nitrogen trifluoride ($NF_3$). Other etchant source gases may also be used such as sulfur hexafluoride ($SF_6$), chlorine trifluoride ($ClF_3$), and others. The etchant source gas 23 may be provided at any suitable flowrate. In various embodiments, the etchant source gas flowrate is less than about 300 sccm (standard cubic centimeters per minute). For example, the etchant source gas flowrate may be about 300 sccm (e.g. for $CF_4$). Alternatively, the etchant source gas flowrate may be about 31 sccm (e.g. for $NF_3$).

Similarly, the type inhibitor source gas 27 may vary based on a given process. In one embodiment, the inhibitor source gas 27 is $O_2$. The inhibitor source gas 27 may also be provided at any suitable flowrate. In various embodiments, the inhibitor source gas flowrate is less than about 500 sccm. In one embodiment, the inhibitor source gas flowrate may be about 440 sccm. The ratio between the flowrate of the etchant source gas and the flowrate of the inhibitor source gas (i.e. flow ratio) may contribute to the properties of the etching process. For example, the flow ratio may be between about 0.1 and about 1.0.

Other gases such as a carrier gas may also be provided in the plasma chamber 60. Such gases may include $N_2$, argon (Ar), and others. The carrier gas flowrates may also be varied depending on desired processing conditions. In some embodiments, the carrier gas flowrate is less than about 1750 sccm. In one embodiment, the carrier gas flowrate is about 1000 sccm (e.g. for $N_2$). In another embodiment, the carrier gas flowrate is about 1600 sccm (e.g. for Ar).

The processes and methods performed by the system 500 may operate at a variety of suitable pressures. In some cases, increasing the pressure in the plasma chamber 60 may be advantageous for increasing selectivity (e.g., for Si:SiGe etches). The pressure in the plasma chamber 60 is greater than about 100 mTorr in various embodiments. In some embodiments, the pressure in the plasma chamber 60 is greater than about 400 mTorr. In one embodiment, the pressure in the plasma chamber 60 is about 900 mTorr.

In the specific case of Si:SiGe etches, the plasma 20 may be a $CF_4/O_2/N_2$ plasma or a $NF_3/O_2/N_2$ plasma, as examples. During these etching processes it may be desirable to maximize the selectivity of Si relative to materials other than just SiGe such as $SiO_2$, $Si_3N_4$, SiOCN and SiBCN, and others. As previously discussed, the etching process can advantageously be a dry etching process made highly selective with selectivity up to and exceeding 50. For example, selectivities of 100 and higher are possible. The incorporation of $O_2$ as a source of inhibitor (oxygen) may advantageously enable preferential oxidation and inverse selectivity. Selectivity may be tuned and maximized by varying [F]:[O] ratio, temperature, pressure, and structural parameters as previously described.

The choice of etchant source gas 23 between $CF_4$ and $NF_3$ may be influenced on the specific effects of C and N during the etching process. For example, carbon chaining at the substrate surface may be appealing in some instances. Conversely, the use of $NF_3$ may be more appealing in some instances due to the elimination of carbonaceous residues on etched surfaces and to enhanced dissociation in the plasma.

The use of $N_2$ may also be advantageous due to the formation of the NO molecule. For example, oxide formation on the Si surface may work to passivate the surface during the etching process, but NO may counteract this by removing the oxide layer by $SiO+NO=Si•+NO_2$ where Si• is a dangling Si bond. This in turn may enable F atoms to consume the dangling Si bonds and facilitate etching.

As previously discussed the higher reactivity of the SiGe may also be used for SiGe:Si etches. For example, an $NF_3$/Ar plasma may be used to etch SiGe selective to Si. The [F]:[Ar] ratio may be varied in order to maximize the selectivity of SiGe relative to Si. In one specific example, a [F]:[Ar] ratio of 0.047 maximizes the SiGe:Si selectivity at about 27.

Temperature may affect the etching processes. For example, for Si:SiGe etches, lower temperatures may enhance SiGe retention and Si recess depth resulting in higher selectivity. As temperature is decreased, the "unzipping effect" of the Si layer becomes more pronounced and may lead to higher Si:SiGe selectivity.

$NF_3$ may be an ideal candidate for selective isotropic etching of GAA device structures in low ion energy radical-rich plasmas. For example, the $CF_4$ may be replaced with $NF_3$ resulting in a reduction in the amount of SiGe etched vertically which may be due to an increase in atomic O available for oxidizing and passivating SiGe instead of reacting with carbon from $CF_4$. The presence of additional O radicals may also account for the increase in the length of the Si-tip due to a decrease in the Si etch rate.

Figure 6:
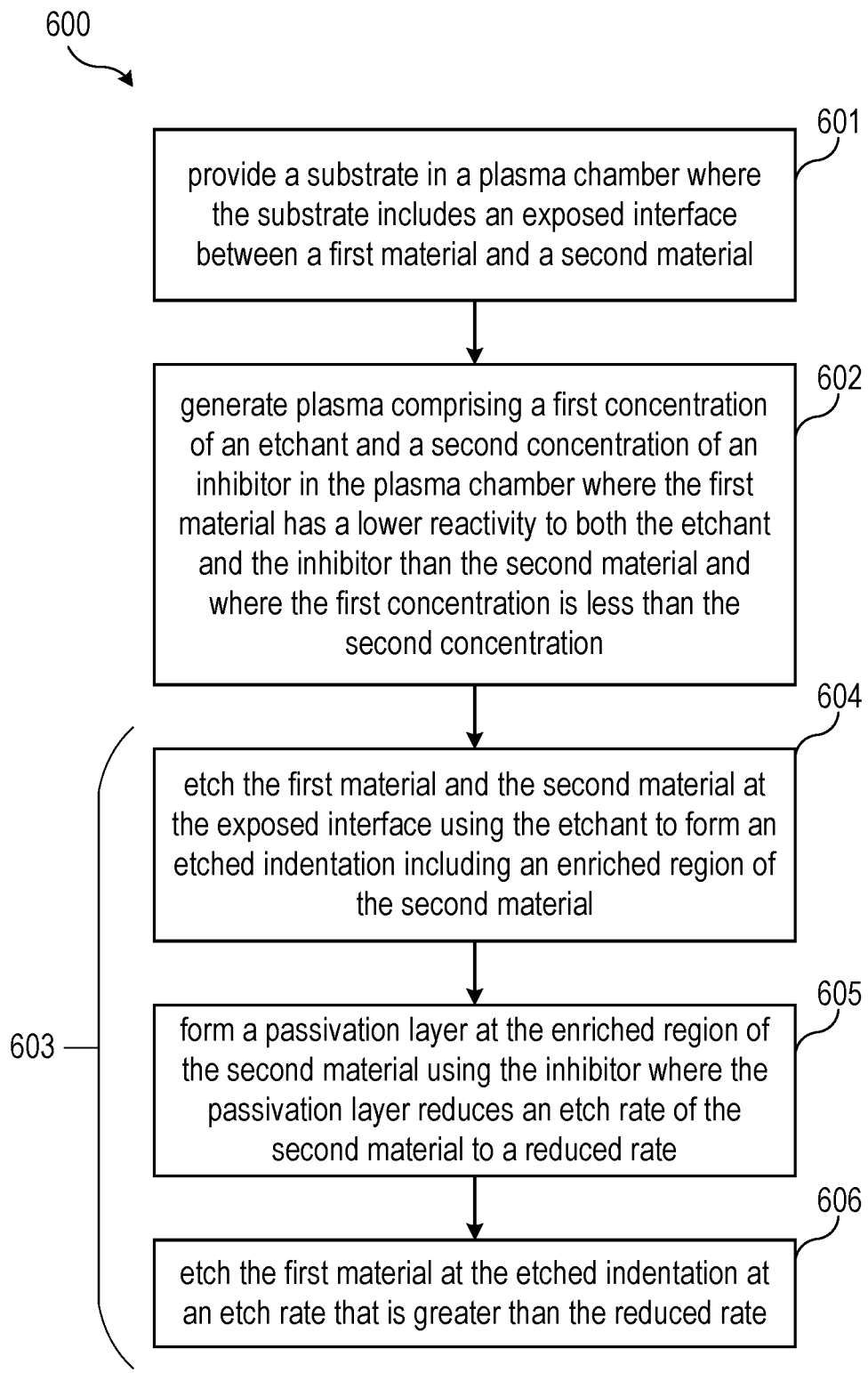
FIG. 6 illustrates an example method that includes a process of treating a substrate in accordance with an embodiment of the invention.

FIG. 6 illustrates an example method that includes a process of treating a substrate in accordance with an embodiment of the invention. The method of FIG. 6 may be performed using embodiment processes and embodiment systems as described herein. For example, the method of FIG. 6 may be combined with any of the embodiments of FIGS. 1A-1C, 2A-2C, and 3-5. The below method steps may be performed in any suitable order as may be apparent to a person of skill in the art.

Referring to FIG. 6, step 601 of a method 600 that includes a process of treating a substrate is to provide a substrate in a plasma chamber where the substrate includes an exposed interface between a first material and a second material. Step 602 includes generating plasma in the plasma chamber. The plasma comprises a first concentration of an etchant and a second concentration of an inhibitor. The first material has a lower reactivity to both the etchant and the inhibitor than the second material. The first concentration is less than the second concentration.

Step 603 includes etching the substrate by exposing the exposed interface to the plasma. Step 603 is accomplished by performing step 604, step 605, and step 606. Specifically, step 604 is to etch the first material and the second material at the exposed interface using the etchant to form an etched indentation including an enriched region of the second material. Step 605 includes forming a passivation layer at the enriched region of the second material using the inhibitor. The passivation layer reduces an etch rate of the second material to a reduced rate.

Step 606 is to etch the first material at the etched indentation at an etch rate that is greater than the reduced rate. The selectivity of the first material relative to the second material may be advantageously enabled by the etch rate of the first material in step 606 being greater than the reduced etch rate of the second material caused by step 605.

Figure 7:
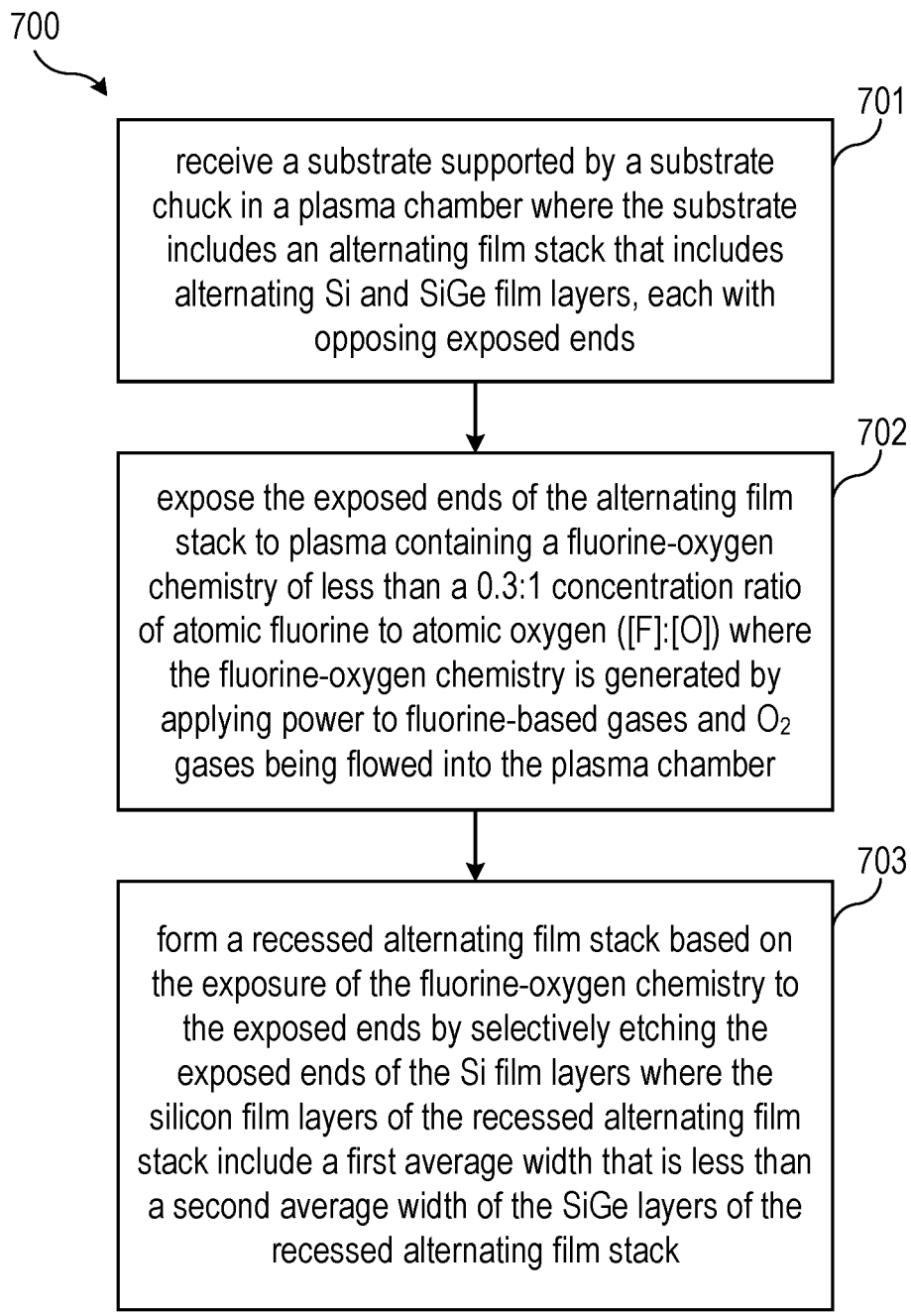
FIG. 7 illustrates an example method that includes a process of etching a substrate in accordance with an embodiment of the invention.

FIG. 7 illustrates an example method that includes a process of etching a substrate in accordance with an embodiment of the invention. The method of FIG. 7 may be performed using embodiment processes and embodiment systems as described herein. For example, the method of FIG. 7 may be combined with any of the embodiments of FIGS. 1A-1C, 2A-2C, and 3-5. Further the method of FIG. 7 may also be combined with the method of FIG. 6. The below method steps may be performed in any suitable order as may be apparent to a person of skill in the art.

Referring to FIG. 7, step 701 of a method 700 that includes a process of treating a substrate is to receive a substrate supported by a substrate chuck in a plasma chamber where the substrate includes an alternating film stack. The alternating film stack includes alternating Si and SiGe film layers, each with opposing exposed ends.

Step 702 includes exposing the exposed ends of the alternating film stack to plasma containing a fluorine-oxygen chemistry of less than a 0.3:1 concentration ratio of atomic fluorine to atomic oxygen ([F]:[O]). The fluorine-oxygen chemistry is generated by applying power to fluorine-based gases and $O_2$ gases being flowed into the plasma chamber. Step 703 is to form a recessed alternating film stack based on the exposure of the fluorine-oxygen chemistry to the exposed ends by selectively etching the exposed ends of the silicon film layers. The Si film layers of the recessed alternating film stack include a first average width. The SiGe film layers of the recessed alternating film stack include a second average width. The first average width is less than a second average.

Example embodiments of the invention are summarized here. Other embodiments can also be understood from the entirety of the specification as well as the claims filed herein.

Example 1

A method of etching a substrate including: providing a substrate in a plasma chamber, the substrate including an exposed interface between a first material and a second material; generating plasma including a first concentration of an etchant and a second concentration of an inhibitor in the plasma chamber, the first material including a lower reactivity to both the etchant and the inhibitor than the second material, where the first concentration is less than the second concentration; and etching the substrate by exposing the exposed interface to the plasma, the etching including etching the first material and the second material at the exposed interface using the etchant to form an etched indentation including an enriched region of the second material, forming a passivation layer at the enriched region of the second material using the inhibitor, the passivation layer reducing an etch rate of the second material to a reduced rate, and etching the first material at the etched indentation at an etch rate that is greater than the reduced rate.

Example 2

The method of example 1, where the etchant includes fluorine and the inhibitor includes oxygen.

Example 3

The method of one of examples 1 and 2, where the plasma includes $O_2$ gas, and where the inhibitor includes oxygen.

Example 4

The method of one of examples 1 to 3, where the plasma includes $NF_3$ gas, and where the etchant includes fluorine dissociated from the $NF_3$ gas.

Example 5

The method of one of examples 1 to 4, where the first material is silicon and the second material is a silicon germanium alloy.

Example 6

The method of one of examples 1 to 5, where, during the etching, pressure in the plasma chamber is greater than about 400 mTorr.

Example 7

The method of one of examples 1 to 6, where the first material is disposed below the second material, and where etching the substrate includes a lateral etching process.

Example 8

A method for treating a substrate, including: receiving a substrate supported by a substrate chuck in a plasma chamber, the substrate including an alternating film stack including alternating silicon and silicon germanium film layers, each with opposing exposed ends; exposing the exposed ends of the alternating film stack to plasma containing a fluorine-oxygen chemistry of less than a 0.3:1 concentration ratio of atomic fluorine to atomic oxygen ([F]:[O]), the fluorine-oxygen chemistry being generated by applying power to fluorine-based gases and $O_2$ gases being flowed into the plasma chamber; and based on the exposure of the fluorine-oxygen chemistry to the exposed ends, forming a recessed alternating film stack by selectively etching the exposed ends of the silicon film layers, where the silicon film layers of the recessed alternating film stack include a first average width that is less than a second average width of the silicon germanium layers of the recessed alternating film stack.

Example 9

The method of example 8, where the first average width is between 2 nm and 20 nm.

Example 10

The method of one of examples 8 and 9, where each of the silicon film layers includes a thickness between 2 nm and 50 nm.

Example 11

The method of example 10, where each of the silicon film layers includes a thickness less than 10 nm.

Example 12

The method of one of examples 8 to 11, where each of the silicon germanium layers includes a thickness between 2 nm and 60 nm.

Example 13

The method of one of examples 8 to 12, where the alternating film stack is formed by heteroepitaxial growth of the alternating silicon and silicon germanium film layers.

Example 14

The method of one of examples 8 to 13, where the fluorine-based gas includes $NF_3$, $SF_6$, $ClF_3$, or $CF_4$.

Example 15

The method of example 14, where the fluorine-based gas is $NF_3$.

Example 16

The method of example 14, where the fluorine-based gas flow and $O_2$ gas flow have a flow ratio between 0.01 to 1.0.

Example 17

The method of one of examples 8 to 16, where pressure in the plasma chamber is greater than about 400 mTorr while exposing the exposed ends.

Example 18

The method of one of examples 8 to 17, where an Si:SiGe selectivity based on a ratio of an average width change of the silicon film layers to an average thickness change of the silicon germanium film layers is greater than 1.

Example 19

The method of example 18, where the Si:SiGe selectivity is greater than 20.

Example 20

The method of one of examples 8 to 19, where a width variation between the exposed ends of the silicon layers of the recessed alternating film stack is less than about 5 nm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a substrate comprising:
providing a substrate in a plasma chamber, the substrate comprising an exposed interface between a first material and a second material;
generating plasma comprising a first concentration of an etchant and a second concentration of an inhibitor in the plasma chamber, the first material comprising a lower reactivity to both the etchant and the inhibitor than the second material, wherein the first concentration is less than the second concentration, wherein the etchant comprises a halogen, and wherein the inhibitor comprises a reducing agent; and
laterally etching the substrate by exposing the exposed interface to the plasma, the etching comprising
etching the first material and the second material at the exposed interface using the etchant to form an etched indentation comprising an enriched region of the second material,
forming a passivation layer at the enriched region of the second material using the inhibitor, the passivation layer reducing an etch rate of the second material to a reduced rate, and
while forming the passivation layer at the enriched region, etching the first material at the etched indentation at an etch rate that is greater than the reduced rate.

2. The method of claim 1, wherein the etchant comprises fluorine and the inhibitor comprises oxygen.

3. The method of claim 1, wherein the plasma comprises $O_2$ gas, and wherein the inhibitor comprises oxygen.

4. The method of claim 1, wherein the plasma comprises $NF_3$ gas, and wherein the etchant comprises fluorine dissociated from the $NF_3$ gas.

5. The method of claim 1, wherein the first material is silicon and the second material is a silicon germanium alloy.

6. The method of claim 1, wherein, during the etching, pressure in the plasma chamber is greater than about 400 mTorr.

7. The method of claim 1, wherein the first material is disposed below the second material, and wherein etching the substrate comprises a lateral etching process.

8. A method for treating a substrate, comprising:
receiving a substrate supported by a substrate chuck in a plasma chamber, the substrate comprising an alternating film stack comprising alternating silicon and silicon germanium film layers, each with opposing exposed ends;
exposing the exposed ends of the alternating film stack to plasma containing a fluorine-oxygen chemistry of less than a 0:3:1 concentration ratio of atomic fluorine to atomic oxygen ([F]:[O]), the fluorine-oxygen chemistry being generated by applying power to fluorine-based gases and $O_2$ gases being flowed into the plasma chamber; and
based on the exposure of the fluorine-oxygen chemistry to the exposed ends, forming a recessed alternating film stack by selectively and laterally etching the exposed ends of the silicon film layers, wherein the silicon film layers of the recessed alternating film stack comprise a first average width that is less than a second average width of the silicon germanium layers of the recessed alternating film stack.

9. The method of claim 8, wherein the first average width is between 2 nm and 20 nm.

10. The method of claim 8, wherein each of the silicon film layers comprises a thickness between 2 nm and 50 nm.

11. The method of claim 10, wherein each of the silicon film layers comprises a thickness less than 10 nm.

12. The method of claim 8, wherein each of the silicon germanium layers comprises a thickness between 2 nm and 60 nm.

13. The method of claim 8, wherein the alternating film stack is formed by heteroepitaxial growth of the alternating silicon and silicon germanium film layers.

14. The method of claim 8, wherein the fluorine-based gas comprises $NF_3$, $SF_6$, or $ClF_3$.

15. The method of claim 14, wherein the fluorine-based gas flow and $O_2$ gas flow have a flow ratio between 0.01 to 1.0.

16. The method of claim 8, wherein pressure in the plasma chamber is greater than about 400 mTorr while exposing the exposed ends.

17. The method of claim 8, wherein an Si:SiGe selectivity based on a ratio of an average width change of the silicon film layers to an average thickness change of the silicon germanium film layers is greater than 1.

18. The method of claim 17, wherein the Si:SiGe selectivity is greater than 20.

19. The method of claim 8, wherein a width variation between the exposed ends of the silicon layers of the recessed alternating film stack is less than about 5 nm.

20. A method for treating a substrate, comprising:
receiving a substrate supported by a substrate chuck in a plasma chamber, the substrate comprising an alternating film stack comprising alternating silicon and silicon germanium film layers, each with opposing exposed ends;
exposing the exposed ends of the alternating film stack to plasma containing a fluorine-oxygen chemistry of less than a 0:3:1 concentration ratio of atomic fluorine to atomic oxygen ([F]:[O]), the fluorine-oxygen chemistry being generated by applying power to $NF_3$ and $O_2$ gases being flowed into the plasma chamber; and
based on the exposure of the fluorine-oxygen chemistry to the exposed ends, forming a recessed alternating film stack by selectively and laterally etching the exposed ends of the silicon film layers, wherein the silicon film layers of the recessed alternating film stack comprise a first average width that is less than a second average width of the silicon germanium layers of the recessed alternating film stack.

\* \* \* \* \*

UNITED STATES PATENT AND TRADEMARK OFFICE
CERTIFICATE OF CORRECTION

PATENT NO. : 11,133,194 B2  
APPLICATION NO. : 16/796675  
DATED : September 28, 2021  
INVENTOR(S) : Sergey Voronin et al.

It is certified that error appears in the above-identified patent and that said Letters Patent is hereby corrected as shown below:

In the Specification

Column 4, Line 28; delete "process too" and insert --process 100--.

Column 4, Line 28; delete "substrate 11*o*" and insert --substrate 110--.

Column 4, Line 47; delete "process too" and insert --process 100--.

Column 5, Line 11; delete "process too" and insert --process 100--.

Column 5, Line 12; delete "process too" and insert --process 100--.

Column 5, Line 23; delete "process too" and insert --process 100--.

Column 5, Line 37; delete "process too" and insert --process 100--.

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*